United States Patent
Yamabe et al.

(10) Patent No.: US 11,642,877 B2
(45) Date of Patent: May 9, 2023

(54) GLASS RESIN LAMINATE, COMPOSITE LAMINATE, AND MANUFACTURING METHOD THEREOF

(71) Applicant: AGC Inc., Tokyo (JP)

(72) Inventors: Atsumi Yamabe, Tokyo (JP); Kohei Yasuda, Tokyo (JP); Nobuaki Ikawa, Tokyo (JP)

(73) Assignee: AGC Inc., Tokyo (JP)

( * ) Notice: Subject to any disclaimer, the term of this patent is extended or adjusted under 35 U.S.C. 154(b) by 140 days.

(21) Appl. No.: 17/071,058

(22) Filed: Oct. 15, 2020

(65) Prior Publication Data

US 2021/0023820 A1 Jan. 28, 2021

Related U.S. Application Data

(63) Continuation of application No. PCT/JP2019/025150, filed on Jun. 25, 2019.

(30) Foreign Application Priority Data

Jun. 29, 2018 (JP) .............................. JP2018-124145

(51) Int. Cl.
*B32B 17/10* (2006.01)
*B32B 27/32* (2006.01)
*B32B 3/30* (2006.01)

(52) U.S. Cl.
CPC .............. *B32B 27/322* (2013.01); *B32B 3/30* (2013.01); *B32B 17/10* (2013.01);
(Continued)

(58) Field of Classification Search
CPC .......... B32B 17/10146; B32B 17/1055; B32B 17/10018
(Continued)

(56) References Cited

U.S. PATENT DOCUMENTS

2015/0219801 A1* 8/2015 Shibuya .............. C03C 17/3405
359/601
2017/0130009 A1* 5/2017 Hosoda ................... B32B 15/08

FOREIGN PATENT DOCUMENTS

JP 2011-11457 A 1/2011
JP 2016-74182 A 5/2016
(Continued)

OTHER PUBLICATIONS

Machine_English_translation_JP_2016074182_A; Hanashima, K.; et al.; Glass-Resin Integrated Member; May 12, 2016; EPO; whole document (Year: 2016).*

(Continued)

*Primary Examiner* — Tahseen Khan
(74) *Attorney, Agent, or Firm* — Oblon, McClelland, Maier & Neustadt, L.L.P.

(57) ABSTRACT

To provide a glass resin laminate of the present invention, in which the glass substrate and the resin layer containing a TFE polymer are strongly laminated, is hardly warped and is excellent in the electrical properties, a composite laminate further having a metal foil, and methods for producing them.

A glass resin laminate comprising a glass substrate 10 having an uneven surface 12 with an arithmetic mean roughness of at least 5 nm, and a resin layer containing a tetrafluoroethylene polymer in contact with the uneven surface 12, wherein the uneven surface 12 has specific convex portions 21 and 22 which narrow at at least a part of the root portion as compared with the tip portion.

10 Claims, 1 Drawing Sheet

(52) U.S. Cl.
CPC .... *B32B 17/10018* (2013.01); *B32B 17/1055* (2013.01); *B32B 17/10146* (2013.01); *B32B 17/10577* (2013.01); *B32B 2307/538* (2013.01)

(58) Field of Classification Search
USPC ........................................................ 428/337
See application file for complete search history.

(56) References Cited

FOREIGN PATENT DOCUMENTS

| | | | |
|---|---|---|---|
| JP | 2016074182 A | * | 5/2016 |
| WO | WO 2014/061615 A1 | | 4/2014 |
| WO | WO 2018/016644 A1 | | 1/2018 |

OTHER PUBLICATIONS

International Search Report dated Oct. 1, 2019 in PCT/JP2019/025150 filed Jun. 25, 2019, 2 pages.

* cited by examiner

GLASS RESIN LAMINATE, COMPOSITE LAMINATE, AND MANUFACTURING METHOD THEREOF

TECHNICAL FIELD

The present invention relates to a glass resin laminate, a composite laminate, and methods for producing them.

BACKGROUND ART

A laminate having a metal foil and an insulating layer is used for a printed board by processing the metal foil by etching. Particularly, a printed board to be used for transmitting radio frequency signals is required to be more excellent in transmission properties, and a fluoropolymer excellent in electrical properties such as a low dielectric constant and a low loss tangent attracts attention as a resin for forming an insulating layer.

In order to stably mount an electronic component on a printed board obtained by processing the metal foil of the laminate, it is important to suppress warpage of the printed board which occurs at the time of mounting. In order to suppress warpage of the printed board, dimensional stability of the laminate is important. As a laminate for a printed board for realizing such dimensional stability, a laminate having a glass substrate, a resin layer comprising a fluoropolymer layer and a polyimide layer, and a copper foil laminated in this order, has been proposed (Patent Document 1).

PRIOR ART DOCUMENTS

Patent Document

Patent Document 1: JP-A-2011-011457

DISCLOSURE OF INVENTION

Technical Problem

If a fluoropolymer having a relatively high linear expansion coefficient as compared with a glass substrate is used as a material for forming a resin layer, the resulting laminate is likely to be warped. Accordingly, the laminate disclosed in Patent Document 1 has a resin layer comprising a thin fluoropolymer layer and a thick polyimide layer are formed so that the expansion and contraction of the resin layer agree with expansion and contraction of the glass substrate, so as to prevent peeling of the resin layer and warpage of the laminate. However, not only a fluoropolymer layer which is intrinsically hydrophobic and has low adhesion, is still insufficient in the peel strength from the glass substrate, but also particularly the peel strength of the laminate to be exposed to a heat shock environment is likely to decrease. Accordingly, a laminate having a glass substrate and a fluoropolymer layer firmly laminated has been desired.

The present invention provides a glass resin laminate in which a glass substrate and a resin layer containing a tetrafluoroethylene polymer are firmly laminated, which is hardly warped, and which is also excellent in electrical properties, a composite laminate further having a metal foil, and methods for producing them.

Solution to Problem

The present inventors have conducted extensive studies and as a result, found that by laminating a resin layer containing a tetrafluoroethylene polymer on a glass substrate having specific surface properties, a laminate having the glass substrate and the resin layer firmly laminated can be obtained, and the laminate is less likely to be warped and is also excellent in electrical properties.

That is, the present invention provides the following.

<1> A glass resin laminate comprising a glass substrate having an uneven surface with an arithmetic mean roughness of at least 5 nm, and a resin layer containing a tetrafluoroethylene polymer in contact with the uneven surface, wherein the uneven surface has a convex portion which narrows at at least a part of the root portion as compared with the tip portion.

<2> The glass resin laminate according to the above <1>, wherein the uneven surface is formed by subjecting the glass substrate to etching treatment with a hydrogen fluoride gas.

<3> The glass resin laminate according to the above <1> or <2>, wherein a space is present at a part of an interface between the glass substrate and the resin layer.

<4> The glass resin laminate according to any one of the above <1> to <3>, wherein the glass substrate has a thickness of from 0.1 to 5 mm, the resin layer has a thickness of from 1 to 1,000 μm, and the ratio of the thickness of the resin layer to the thickness of the glass substrate is from 0.01 to 0.2.

<5> The glass resin laminate according to any one of the above <1> to <4>, wherein glass used for the glass substrate has an iron oxide content of from 0 to 1,000 ppm.

<6> The glass resin laminate according to any one of the above <1> to <5>, wherein the resin layer is a non-porous resin layer.

<7> The glass resin laminate according to any one of the above <1> to <6>, wherein the tetrafluoroethylene polymer is a tetrafluoroethylene polymer having a temperature region in which the storage elastic modulus is from 0.1 to 5.0 MPa at 260° C. or lower, and having a melting point of higher than 260° C.

<8> The glass resin laminate according to any one of the above <1> to <7>, wherein the tetrafluoroethylene polymer has units based on tetrafluoroethylene and units based on at least one monomer selected from the group consisting of a perfluoro(alkyl vinyl ether), hexafluoropropylene and a fluoroalkylethylene.

<9> The glass resin laminate according to any one of the above <1> to <8>, wherein the tetrafluoroethylene polymer has at least one type of functional group selected from the group consisting of a carbonyl group-containing group, a hydroxy group, an epoxy group, an amide group, an amino group and an isocyanate group.

<10> A method for producing a glass resin laminate, which comprises applying a powder dispersion which contains a liquid medium and a powder containing a tetrafluoroethylene polymer and having a volume based cumulative 50% size of from 0.05 to 6.0 μm, to an uneven surface of a glass substrate having an uneven surface with an arithmetic mean roughness of at least 5 nm, and the uneven surface having a convex portion which narrows at at least a part of the root portion as compared with the tip portion, heating the powder dispersion on the uneven surface of the glass substrate to remove the liquid medium and then firing the powder, to obtain a glass resin laminate comprising the glass substrate and a resin layer containing a tetrafluoroethylene polymer in contact with the uneven surface.

<11> A composite laminate having a glass substrate having an uneven surface with an arithmetic mean roughness of at least 5 nm, a resin layer containing a tetrafluoroethylene polymer in contact with the uneven surface, and a metal foil in contact with the resin layer, wherein the uneven surface has a convex portion which narrows at at least a part of the root portion as compared with the tip portion.

<12> A method for producing a composite laminate, which comprises contact-bonding a metal foil and a glass resin laminate comprising a glass substrate having an uneven surface with an arithmetic mean roughness of at least 5 nm, and the uneven surface having a convex portion which narrows at at least a part of the root portion as compared with the tip portion, and a resin layer containing a tetrafluoroethylene polymer in contact with the uneven surface, by hot press method, to obtain a composite laminate having the glass substrate, the resin layer and the metal foil.

<13> A method for producing a printed board, which comprises subjecting the metal foil of the composite laminate as defined in the above <11> to etching treatment to form a transmission circuit thereby to obtain a printed board.

Advantageous Effects of Invention

The glass resin laminate and the composite laminate of the present invention have a glass substrate and a resin layer containing a tetrafluoroethylene polymer firmly laminated and are thereby less likely to be warped, and are also excellent in electrical properties.

According to the method for producing a glass resin laminate of the present invention, it is possible to produce a glass resin laminate which has a glass substrate and a resin layer containing a tetrafluoroethylene polymer firmly laminated and is thereby less likely to be warped, and is also excellent in electrical properties.

A composite laminate of the present invention has a glass substrate and a resin layer containing a tetrafluoroethylene polymer firmly laminated and is thereby less likely to be warped, and is also excellent in electrical properties.

According to the method for producing a composite laminate of the present invention, it is possible to produce a composite laminate which has a glass substrate and a resin layer containing a tetrafluoroethylene polymer firmly laminated and is thereby less likely to be warped, and is also excellent in electrical properties.

DESCRIPTION OF EMBODIMENTS

The following terms have the following meanings.

The "arithmetic mean roughness (Ra)" is a value determined by measuring a surface of a glass substrate within 1 um$^2$ range using an atomic force microscope (AFM).

The "melting point of a polymer" is a temperature corresponding to a maximum value of a melting peak measured by differential scanning calorimetry (DSC).

The "D50 of a powder" is a volume-based cumulative 50% size of a powder obtained by laser diffraction/scattering method. That is, it is a particle size at a point where the cumulative volume is 50% on a cumulative curve obtained by measuring a particle size distribution of the powder by laser diffraction/scattering method and taking the whole volume of the group of particles of the powder being 100%.

The "D90 of a powder" is a volume based cumulative 90% size of a powder obtained in the same manner as the above D50.

The "dielectric constant" is a value obtained at 1 MHz using a dielectric breakdown test apparatus in a test environment at a temperature within a range of 23° C.±2° C. under a relative humidity within a range of 50%±5% RH, by means of transformer bridge method in accordance with ASTM D150.

The "heat resistant resin" is a high molecular weight compound having a melting point of at least 280° C. or a high molecular weight compound having a maximum continuous use temperature of at least 121° C. as defined in JIS C4003:2010 (IEC 60085:2007).

The "unit" of a polymer may be an atomic group directly formed from one monomer molecule by polymerization reaction or may be an atomic group having a part of the structure of the atomic group converted by treating a polymer obtained by the polymerization reaction by a predetermined method. A unit based on monomer A may sometimes be referred to as "monomer A unit".

Figure 1:
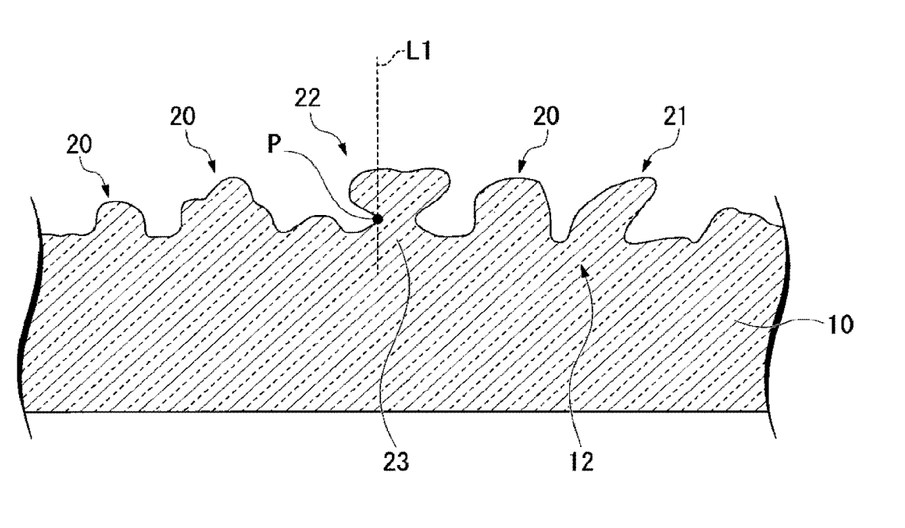
FIG. 1 is a cross sectional view illustrating an example of a glass substrate.

The dimensional ratio in FIG. 1 may be different from an actual one for convenience of explanation.

The glass resin laminate of the present invention is a laminate having a resin layer (hereinafter sometimes referred to as "F resin layer") containing a tetrafluoroethylene polymer (hereinafter sometimes referred to as "TFE polymer") directly laminated on the surface of a glass substrate having a predetermined shape.

The present inventors have paid attention to the shape of the surface of a glass substrate, so as to obtain a laminate having a TFE polymer itself which is intrinsically hydrophobic and has low adhesion firmly laminated on the glass substrate, and found that the arithmetic mean roughness (hereinafter sometimes referred to as "Ra", and Ra in the present invention is at least 5 nm) of the surface of the glass substrate has influence over the peel strength between the glass substrate and the F resin layer. They have further found that when the uneven surface of the glass substrate has a predetermined shape (the shape in the present invention is a shape having a convex portion which narrows at at least a part of the root portion as compared with the tip portion), not only the peel strength between the glass substrate and the F resin layer further improves but also even when the F resin layer having a relatively high linear expansion coefficient as compared with the glass substrate is directly laminated on the glass substrate, the resulting laminate is less likely to be warped, and accomplished the present invention.

The warpage of the glass resin laminate of the present invention is preferably at most 0.5%, particularly preferably at most 0.1%. When the warpage of the glass resin laminate is at most the above upper limit value, electronic components can stably be mounted on a printed board obtained from such a glass resin laminate.

Glass to be used for the glass substrate of the present invention may, for example, be soda lime glass, aluminosilicate glass, borosilicate glass or alkali free aluminoborosilicate glass, and they may properly be selected depending upon properties required.

When low loss property is needed, for the glass substrate, it is preferred to use glass having a loss tangent (tan δ) at 35 GHz of at most 0.01. tan δ is more preferably at most 0.007, particularly preferably at most 0.005. On the other hand, if tan δ is too low, the melting property and the forming property of the glass tend to decrease and the productivity will decrease, and accordingly tan δ is preferably at least 0.0003, more preferably at least 0.0005. When the loss tangent of the glass substrate is within the above range, the loss tangent in a radio frequency region can further be reduced. The dielectric constant of the glass substrate at 35 GHz is more preferably at most 10. The loss tangent and the dielectric constant of the glass substrate can be measured in accordance with the method as specified in JIS R1641:2007 using a cavity resonator and a vector network analyzer.

By using glass such that the loss tangent at 35 GHz is within the above range, low loss property at a predetermined radio frequency can be obtained, and as a specific glass, alkali-free aluminoborosilicate glass is preferred. Such alkali-free alum inoborosilicate glass may, for example, be glass comprising, as represented by mol % based on oxides, from 50 to 80% of $SiO_2$, from 1 to 20% of $Al_2O_3$, from 1 to 30% of $B_2O_3$, from 1 to 30% of R'O (wherein R' is Mg, Ca, Sr, Ba or Zn), and from 0 to 0.1% of R"O (wherein R" is Li, Na or K). Preferred is such glass wherein the total content of R"O is within a range of from 0.001 to 5% and the molar ratio of $Na_2O/(Na_2O+K_2O)$ among the alkali metal oxides is within a range of from 0.01 to 0.99. More preferred is such glass wherein $Al_2O_3$ and $B_2O_3$ are contained in a total content of from 1 to 40%, the molar ratio of $Al_2O_3/(AlO_3+B_2O_3)$ is within a range of from 0 to 0.45, and the $SiO_2$ content is maximum among the proportions of the components as represented by mol % based on oxides. Such a glass substrate may be obtained by the method disclosed in WO2018/051793.

In order to increase the rigidity of the laminate, the elastic modulus of the glass to be used for the glass substrate is preferably at least 65 GPa. The elastic modulus is more preferably at least 70 GPa, further preferably at least 75 GPA. Further, in order to increase thermal stability at the time of use, the thermal expansion coefficient (50 to 350° C.) of the glass to be used for the glass substrate is preferably from $10\times10^{-7}$ to $130\times10^{-7}/°$ C. If it is too low, the glass viscosity tends to be too high, forming into a plate shape tends to be difficult, and it will be difficult to obtain a plate glass, and accordingly the thermal expansion coefficient is preferably at least $20\times10^{-7}/°$ C., more preferably at least $30\times10^{-7}/°$ C. Further, if it is too high, thermal stress is likely to generate in the glass, and possibility of breakage at the time of use tends to be high, and accordingly the thermal expansion coefficient is preferably $110\times10^{-7}/°$ C., more preferably at most $100\times10^{-7}/°$ C.

Such glass may, for example, be glass comprising, as represented by mol %, from 60 to 80% of $SiO_2$, from 0 to 20% of $Al_2O_3$, from 0 to 10% of $B_2O_3$, from 1 to 30% of R'O (wherein R' is Mg, Ca, Sr, Ba or Zn), and from 0 to 30% of R"$_2$O (wherein R" is Li, Na or K). The elastic modulus of the glass substrate may be adjusted by the composition and heat history of glass to be a glass substrate. The elastic modulus of the glass substrate may be measured by ultrasonic pulse method in accordance with the method as specified by JIS Z2280:1993. Further, the thermal expansion coefficient may be adjusted by the content and heat history of particularly an alkali metal oxide or an alkaline earth metal oxide in the glass composition. The average thermal expansion coefficient at from 50 to 350° C. may be measured by a differential thermal dilatometer, in accordance with the method as specified by JIS R3102:1995.

Further, with a view to suppressing yellowing of the glass resin laminate and the composite laminate of the present invention, the content of iron oxide in the glass to be used for the glass substrate is preferably from 0 to 1,000 ppm (from 0 to 0.093 mol %), particularly preferably from 0 to 500 ppm (from 0 to 0046 mol %). It is considered that yellowing caused by shift of oxidation-reduction state of iron oxide by the TFE polymer tends to be suppressed when the content of iron oxide in the glass is within the above range. When the content of iron oxide in the glass to be used for the glass substrate is within such a range, the glass resin composite, the composite laminate and a printed board obtained from the composite laminate of the present invention (hereinafter sometimes referred to generally as "article of the present invention") have a high light transmittance and are suitably used for an opening member portion of a building, a vehicle or the like. Further, when the article of the present invention is used for the opening member portion, with a view to adjusting the light transmittance and the color tone, glass having a composition to shield long wavelength visible light may be used to suppress yellowing of the article of the present invention.

The lower limit value of the thickness of the glass substrate is preferably 0.03 mm, more preferably 0.05 mm, further preferably 0.1 mm, most preferably 0.5 mm.

The upper limit value of the thickness of the glass substrate is preferably 30 mm, more preferably 10 mm, further preferably 2 mm, still more preferably 1 mm, most preferably 0.2 mm. When the thickness of the glass substrate is at least the lower limit value, the glass resin laminate will be less likely to be warped. When the thickness of the glass substrate is at most the above upper limit value, the printed wiring board can be made sufficiently thin.

The glass substrate has an uneven surface with Ra of at least 5 nm.

The glass substrate has the uneven surface on at least one side, and may have the uneven surface on both sides.

Ra of the uneven surface of the glass substrate is at least 5 nm, preferably at least 7 nm, particularly preferably at least 10 nm. When Ra of the uneven surface of the glass substrate is at least the above lower limit value, the peel strength between the glass substrate and the F resin layer tends to be high.

Ra of the uneven surface of the glass substrate is preferably at most 50 nm, particularly preferably at most 40 nm. When Ra of the uneven surface of the glass substrate is at most the above upper limit value, high adhesion will be obtained while transparency is maintained.

Th uneven surface has a convex portion which narrows at at least a part of the root portion as compared with the tip portion.

FIG. 1 is a cross sectional view illustrating an example of a glass substrate. A glass substrate 10 has un uneven surface 12 having a large number of convex portions 20 at nanometer order. The convex portions 20 include convex portions such that at least part of the root portion narrows as compared with the tip portion (hereinafter sometimes referred to as "specific convex portions").

For example, in FIG. 1, two specific convex portions 21 and 22 are confirmed. The specific convex portion 21 narrows at its root portion on one side (right side). The specific convex portion 22 narrows at its root portion on both sides and has a so-called neck portion 23. The neck portion 23 means a lower portion having a small cross sectional area as compared with an upper portion in the convex portion 20 formed on the uneven surface 12, that is a narrow portion.

Whether or not the convex portion 20 has the neck portion 23 is judged as follows.

As shown in FIG. 1, a straight line L1 is drawn in parallel with the thickness direction of the glass substrate 10 so that it passes a portion (point P) at which the size of one convex portion (for example specific convex portion 22) is smallest, on the glass substrate 10. When the straight line L1 intersects with the specific convex portion 22 on a portion above the point P (direction away from the uneven surface 12), the specific convex portion 22 is judged to have a neck portion 23.

The uneven surface 22 having a specific convex portion may be formed, for example, by subjecting the glass substrate to etching treatment with a hydrogen fluoride gas.

In the glass resin laminate of the present invention, by the presence of the uneven surface having a specific convex portion, significantly high adhesion by an anchor effect between the glass substrate and the F resin layer can be obtained. Particularly when the uneven surface has a specific convex portion with a neck portion, the anchor effect tends to be remarkable, and very high adhesion between the glass substrate and the F resin layer can be obtained. Further, by the uneven surface having the specific convex portion, when the F resin layer is laminated, warpage of the glass resin layer can be suppressed.

The F resin layer in the present invention contains a TFE polymer. The TFE polymer is preferably a hot-melt TFE polymer.

The F resin layer may contain, within a range not to impair the effects of the present invention, as the case requires, an inorganic filler, a resin other than a fluororesin, additives, or the like.

The thickness of the F resin layer is preferably from 1 to 100 μm, more preferably from 3 to 50 μm, particularly preferably from 5 to 25 μm. When the thickness of the F resin layer is at least the above lower limit value, the resulting printed board will have more excellent transmission properties. When the thickness of the F resin layer is at most the above upper limit value, the glass resin laminate will further hardly be warped.

The ratio of the thickness of the F resin layer to the thickness of the glass substrate is preferably from 0.01 to 0.2, particularly preferably from 0.05 to 0.1. When the ratio of the thickness of the F resin layer to the thickness of the glass substrate is at least the above lower limit value, the resulting printed board will have more excellent transmission properties. When the ratio of the thickness of the F resin layer to the thickness of the glass substrate is at most the above upper limit value, the glass resin laminate will further hardly be warped.

The dielectric constant of the F resin layer is preferably from 2.0 to 6.0, more preferably from 2.0 to 3.5, particularly preferably from 2.0 to 3.0. When the dielectric constant is at most the upper limit value of the above range, the glass resin laminate can suitably be used for e.g. a printed board which is required to have a low dielectric constant. When the dielectric constant of the F resin layer is at least the lower limit value of the above range, both electric properties and adhesion of the F resin layer will be excellent.

The F resin layer is preferably a non-porous resin layer. The non-porous resin layer is excellent in electrical properties and acid resistance (e.g. etching resistance). The non-porous resin layer has substantially no space except for a space present at the interface with the glass substrate if any. Such a dense non-porous resin layer is preferably a resin layer containing a melt of a resin, particularly preferably a resin layer consisting of a melt of a resin.

The TFE polymer is preferably melt-formable polymer, and its melting point is preferably higher than 260° C., more preferably higher than 260° C. and at most 320° C., particularly preferably from 275 to 320° C. When the melting point of the TFE polymer is within the above range, the TFE polymer is fired while maintaining the adhesion due to its elasticity, whereby a dense F resin layer will more easily be formed.

The TFE polymer preferably has a temperature region in which the storage elastic modulus is from 0.1 to 5.0 MPa at 260° C. or lower. The storage elastic modulus of the TFE polymer is preferably from 0.2 to 4.4 MPa, particularly preferably from 0.5 to 3.0 MPa. The temperature region in which the TFE polymer has such a storage elastic modulus is preferably from 180 to 260° C., particularly preferably from 200 to 260° C. In such a temperature region, the TFE polymer tends to effectively show adhesion due to its elasticity.

The TFE polymer is a polymer having TFE units. The TFE polymer may be a TFE homopolymer or may be a copolymer of TFE and other monomer copolymerizable with TFE (hereinafter sometimes referred to as comonomer). The TFE polymer has from 75 to 100 mol % of TFE units and from 0 to 25 mol % of unites based on the comonomer, to all the units constituting the polymer.

The comonomer may, for example, be a perfluoro(alkyl vinyl ether) (hereinafter sometimes referred to as "PAVE"), a fluoroalkylethylene (hereinafter sometimes referred to as "FAE"), hexafluoropropylene (hereinafter sometimes referred to as "HFP") or an olefin.

The TFE polymer may, for example, be polytetrafluoroethylene, a copolymer of TFE and ethylene, a copolymer of TFE and propylene, a copolymer of TFE and propylene, a copolymer of TFE and PAVE, a copolymer of TFE and HFP, a copolymer of TFE and FAE, or a copolymer of TFE and chlorotrifluoroethylene.

PAVE may, for example, be $CF_2\!\!=\!\!CFOCF_3$, $CF_2\!\!=\!\!CFOCF_2CF_3$, $CF_2\!\!=\!\!CFOCF_2CF_2CF_3$ (PPVE), $CF_2\!\!=\!\!CFOCF_2CF_2CF_2CF_3$ or $CF_2\!\!=\!\!CFO(CF_2)_8F$.

FAE may, for example, be $CH_2\!\!=\!\!CH(CF_2)_2F$, $CH_2\!\!=\!\!CH(CF_2)_3F$, $CH_2\!\!=\!\!CH(CF_2)_4F$, $CH_2\!\!=\!\!CF(CF_2)_3H$ or $CH_2\!\!=\!\!CF(CF_2)_4H$.

As a preferred embodiment of the TFE polymer, a polymer containing TFE units and units based on at least one monomer selected from the group consisting of PAVE, HFP and FAE (hereinafter sometimes referred to as "comonomer units F") may also be mentioned.

The polymer preferably has from 90 to 99 mol % of TFE units and from 1 to 10 mol % of the comonomer units F to all the units constituting the polymer. The polymer may consist solely of TFE Units and the comonomer units F, or may further contain other units.

As a preferred embodiment of the TFE polymer, a polymer having TEE units and having at least one type of functional group selected from the group consisting of a carbonyl group-containing group, a hydroxy group, an epoxy group, an amide group, an amino group and an isocyanate group (hereinafter sometimes referred to as "polymer $F^1$") may also be mentioned, in view of adhesion between the F resin and the glass substrate.

The functional group may be contained in the units of the TFE polymer or may be contained in the terminal group of the main chain of the polymer $F^1$. The latter polymer may be a polymer having the functional group as a terminal group derived from a polymerization initiator, a chain transfer agent or the like.

The polymer $F^1$ is preferably a polymer having units having a functional group and TFE units. Further, the polymer $F^1$ in such a case more preferably has other units, particularly preferably has the comonomer units F.

The functional group is preferably a carbonyl group-containing group in view of adhesion between the F resin layer and the glass substrate. The carbonyl group-containing group may, for example, be a carbonate group, a carboxy group, a haloformyl group, an alkoxycarbonyl group, an acid anhydride residue (—C(O)OC(O)—) or a fatty acid residue, and is preferably a carboxy group or an acid anhydride residue.

The units having a functional group are preferably units based on a monomer having a functional group, particularly preferably units based on a monomer having a carbonyl group-containing group.

The monomer having a carbonyl group-containing group is preferably a cyclic monomer having an acid anhydride residue, a monomer having a carboxy group, a vinyl ester or a (meth)acrylate, particularly preferably a cyclic monomer having an acid anhydride residue.

The cyclic monomer is preferably itaconic anhydride, citraconic anhydride, 5-norbornene-2,3-dicarboxylic anhydride (another name: himic anhydride, hereinafter sometimes referred to as "NAH") or maleic anhydride.

The polymer $F^1$ is preferably a polymer having units having a functional group, TFE units, and PAVE units or HFP units. As a specific example of such a polymer $F^1$, the polymer (X) described in WO2018/16644 may be mentioned.

The proportion of the TFE units in the polymer $F^1$ is preferably from 90 to 99 mol % to all the units constituting the polymer $F^1$.

The proportion of the PAVE units in the polymer $F^1$ is preferably from 0.5 to 9.97 mol % to all the units constituting the polymer $F^1$.

The proportion of the units having a functional group in the polymer $F^1$ is preferably from 0.01 to 3 mol % to all the units constituting the polymer $F^1$.

In the glass resin laminate of the present invention, it is preferred that a space is present at a part of an interface between the glass substrate and the F resin layer.

It is considered that a space present at a part of the interface between the glass substrate and the F resin layer acts as a buffer which absorbs expansion and contraction of the F resin layer, whereby warpage of the glass resin laminate can sufficiently be suppressed. It is also considered that the presence of the space reduces the contact area between the glass substrate and the F resin layer and decreases the peel strength between the glass substrate and the F resin layer, however, the glass resin laminate of the present invention has a glass substrate such that the uneven surface has a specific convex portion, whereby the warpage of the glass resin laminate can sufficiently be suppressed while the peel strength between the glass substrate and the F resin layer is maintained.

It is also considered that the presence of a space improves electrical properties of the glass resin laminate and more suppresses the transmission loss of a printed board obtained from the glass resin laminate of the present invention. For example, it is considered that a space (air layer) present at the interface in the glass resin laminate of the present invention functions also as an insulating layer which blocks transmission of an electric field caused when an electric current flows in the transmission circuit of the printed board to the glass and can effectively suppress transmission loss. It is also considered that the space functions as an insulating layer and accordingly even when the F resin layer is made thin, a glass resin laminate excellent in electrical properties will be obtained.

The space is preferably present on the side surface of the convex portion on the uneven surface of the glass substrate, with a view to balancing suppression of warpage of the glass resin laminate and electrical properties.

The space may be present on each of the side surface of the convex portion and the bottom of the convex portion of the glass substrate, however, in such a case, the number of the spaces present on the side surface of the convex portion is smaller than the number of the spaces present on the bottom of the convex portion, with a view to keeping the peel strength of the glass substrate and the F resin layer.

Further, it is preferred that the space is not present at the tip surface of the convex portion on the uneven surface of the glass substrate and at the interface with the F resin layer.

The method for producing the glass resin laminate of the present invention is a method which comprises applying a powder dispersion which contains a liquid medium and a powder containing a TFE polymer and having a specific D50, to the surface of a glass substrate having a specific uneven surface, heating the powder dispersion on the uneven surface of the glass substrate to remove the liquid medium and then firing the powder, to obtain a glass resin laminate comprising the glass substrate and a F resin layer in contact with the uneven surface.

The liquid medium is preferably a compound having a boiling point lower than those of components other than the liquid medium contained in the powder dispersion and unreactive with the powder.

The liquid medium may, for example, be water, an alcohol (such as methanol or ethanol), a nitrogen-containing compound (such as N,N-dimethylformamide, N,N-dimethylacetamide or N-methyl-2-pyrollidone), a sulfur-containing compound (such as dimethyl sulfoxide), an ether (such as diethyl ether or dioxane), an ester (such as ethyl lactate or ethyl acetate), a ketone (such as methyl ethyl ketone or methyl isopropyl ketone), a glycol ether (such as ethylene glycol monoisopropyl ether) or a cellosolve (such as methyl cellosolve or ethyl cellosolve). The liquid medium may be used in combination of two or more.

The powder containing the TFE polymer (hereinafter sometimes referred to as "F powder") may contain a component other than the TFE polymer within a range not to impair the effects of the present invention, but preferably contains the TFE polymer as the main component. The content of the TFE polymer in the F powder is preferably at least 80 mass %, particularly preferably 100 mass %.

D50 of the F powder is from 0.05 to 6.0 μm, preferably from 0.1 to 3.0 μm, particularly preferably from 0.2 to 3.0 μm. Within such a range, both flowability and dispersibility of the F powder will be good, and the electrical properties (such as low dielectric constant) and the heat resistance of the F resin layer are most likely to be obtained.

D90 of the F powder is preferably at most 8 μm, more preferably at most 6 μm, particularly preferably at most 5 μm. D90 of the powder is preferably at least 0.3 μm, particularly preferably at least 0.8 μm. Within such a range, both flowability and dispersibility of the F powder will be good, and the electrical properties (such as low dielectric constant) and the heat resistance of the F resin layer are most likely to be obtained.

A method for producing the F powder is not particularly limited, and the method described in WO2016/017801, paragraphs [0095] to [0069] may be employed. As the F powder, a commercial product may be used if available.

The powder dispersion may contain a resin other than the TFE polymer (hereinafter sometimes referred to as "other resin"). Such other resin may be a resin soluble in the liquid medium or a resin insoluble in the liquid medium.

Other resin may be a non-curable resin or may be a thermosetting resin.

The non-curable resin may be a hot melt resin such as a thermoplastic polyimide or a non-melt resin such as a cured product of a curable resin.

The thermosetting resin may, for example, be an epoxy resin, a thermosetting acrylic resin, a phenol resin, a thermosetting polyester resin, a thermosetting polyolefin resin, a thermosetting modified polyphenylene ether resin, a polyfunctional cyanate resin, a polyfunctional maleimide-cyanate resin, a polyfunctional maleimide resin, a vinyl ester resin, a urea resin, a diallyl phthalate resin, a melamine resin, a guanamine resin, a melamine-urea co-condensed resin, a thermosetting fluororesin (excluding a TFE polymer having an adhesive group), a thermosetting polyimide or its precursor polyamic acid.

The thermosetting resin is, in view of usefulness for a printed board, preferably an epoxy resin, a thermosetting acrylic resin, a bismaleimide resin, a thermosetting modified polyphenylene ether resin, a thermosetting polyimide or its precursor polyamic acid, particularly preferably an epoxy resin, a thermosetting modified polyphenylene ether resin, a thermosetting polyimide or its precursor polyamic acid. The thermosetting resin may be used in combination of two or more.

Other component which may be contained in the powder dispersion may, for example, be a surfactant, a defoaming agent, an inorganic filler, a reactive alkoxysilane, a dehydrating agent, a plasticizer, a weathering agent, an antioxidant, a heat stabilizer, a lubricant, an antistatic agent, a brightening agent, a coloring agent, a conducting agent, a release agent, a surface treatment agent, a viscosity-adjusting agent or a flame retardant.

The proportion of the F powder in the powder dispersion is preferably from 5 to 60 mass %, particularly preferably from 30 to 50 mass %. When the proportion of the F powder is within the above range, not only the dielectric constant and the loss tangent of the F resin layer can be kept low, but also the dispersibility of the F powder in the powder dispersion will be excellent, and the mechanical strength of the F resin layer will be excellent.

The proportion of the liquid medium in the powder dispersion is preferably from 15 to 65 mass %, particularly preferably 25 to 50 mass %. When the proportion of the liquid medium is within the above range, coating property of the powder dispersion to the glass substrate and the outer appearance of the F resin layer to be formed will be good.

In a case where the powder dispersion contains other resin, the proportion of other resin in the powder dispersion is preferably from 1 to 50 mass %, particularly preferably from 5 to 30 mass %. When the proportion of other resin is within the above range, the mechanical strength of the F resin layer and the dielectric constant and the loss tangent of the F resin layer tend to be balanced.

In a case where the powder dispersion contains a surfactant, the proportion of the surfactant in the powder dispersion is preferably from 0.1 to 30 mass %, particularly preferably from 1 to 10 mass %. When the proportion of the surfactant is at least the above lower limit value, the F powder tends to be uniformly dispersed in the powder dispersion. When the proportion of the surfactant is at most the above upper limit value, the dielectric constant and the loss tangent of the F resin layer can be made further lower.

As a method of applying the powder dispersion to the uneven surface of the glass substrate, spray coating method, roll coating method, spin coating method, gravure coating method, microgravure coating method, gravure offset method, knife coating method, kiss roll coating method, bar coating method, die coating method, fountain mayer bar method, or slot die coating method may, for example, be mentioned.

In drying after the powder dispersion is applied to the uneven surface of the glass substrate (that is removal by volatilization of the liquid medium), the liquid medium is not necessarily completely volatilized, and the liquid medium is volatilized to such an extent that a stable self-supporting membrane is formed from a wet film formed by application of the powder dispersion. In drying, it is preferred that at least 50 mass % of the liquid medium contained in the powder dispersion is volatilized. Drying may be conducted in one step or may be conducted in several steps with different temperatures.

The drying method may, for example, be a method of using an oven, a method of using a circulating-air oven or a method of irradiation with heat rays such as infrared rays.

The drying temperature is preferably from 50 to 150° C., more preferably from 80 to 100° C. When the heating temperature is within the above range, the productivity of the glass resin laminate, and the adhesion between the F resin layer and the glass substrate tend to improve. The drying temperature usually means the temperature of the atmosphere.

The drying time is preferably from 0.1 to 30 minutes, more preferably from 0.5 to 20 minutes.

Firing is conducted at a temperature at which the TFE polymer in the F powder is melted. At least a part of the TFE polymer in the self-supporting membrane is melted and then quenched to form the F resin layer. By melting at least a part of the TFE polymer, not only fusion of the respective particles of the F powder proceeds but also the TFE polymer is highly filled in the uneven surface of the glass substrate, whereby the adhesion between the glass substrate and the F resin layer tends to be excellent. In a case where the powder dispersion contains other resin, for example, in a case where the powder dispersion contains other hot melt resin, a F resin layer having the TFE polymer and the resin melt-blended is formed, and in a case where the powder dispersion contains other thermosetting resin, a F resin layer comprising a cure product of the TFE polymer and the resin is formed.

The firing method may, for example, be a method of using an oven, a method of using a circulating-air oven or a method of irradiation with heat rays such as infrared rays. In order to improve smoothness of the surface of the F resin layer, the laminate may be pressurized by a hot plate or a heat roll. The firing method is preferably a method of irradiation with infrared rays, whereby the F powder can be fired in a short time and the apparatus is relatively small.

The effective waveband of the infrared rays is preferably from 2 to 20 μm, particularly preferably from 3 to 7 μm, whereby the F powder can be homogeneously fired and a uniform F resin layer can be formed. Further, heating by irradiation with infrared rays and heating by hot air may be combined.

The firing atmosphere is, with a view to suppressing oxidation of the glass substrate and the F resin layer, preferably an atmosphere with an oxygen gas concentration of from 100 to 500 ppm, particularly preferably from 200 to 300 ppm.

The atmosphere is preferably an inert gas atmosphere or a reducing gas atmosphere.

The inert gas may, for example, be a helium gas, a neon gas, an argon gas or a nitrogen gas and is preferably a nitrogen gas.

The reducing gas may be a hydrogen gas. The reducing gas atmosphere is preferably a mixed gas of at least 0.1 vol % and less than 4 vol % of a hydrogen gas and a nitrogen gas.

The firing temperature is preferably at least 300° C., more preferably from 330 to 380° C., particularly preferably from 350 to 370° C. When the firing temperature is within the above range, not only fusion of the respective particles of the F powder proceeds but also the TFE polymer is highly filled in the uneven surface of the glass substrate, whereby the adhesion between the glass substrate and the F resin layer tends to be excellent. The firing temperature usually means the temperature of the atmosphere.

The firing time is preferably from 1 to 60 minutes, particularly preferably from 5 to 30 minutes. When the firing time is within the above range, the TFE polymer is highly filled in the uneven surface of the glass substrate, and the productivity of the glass resin laminate will be excellent.

Further, as described above, in a case where the glass to be used for the glass substrate has an iron oxide content of from 0 to 1,000 ppm (preferably from 0 to 500 ppm), yellowing of the glass resin laminate caused by shift of the oxidation-reduction state of iron oxide by the TFE polymer, by heating, is particularly likely to be suppressed.

The glass resin laminate of the present invention is useful, for example, as an insulating material of a printed board. A printed board using the glass resin laminate of the present invention as the material is less likely to be warped, whereby not only the yield in the production process improves but also interlayer lamination hardly occurs even in a severe environment such as in a high temperature high humidity environment.

The composite laminate of the present invention comprises a glass substrate having a specific uneven surface, a F resin layer in contact with the uneven surface, and a metal foil in contact with the F resin layer.

The layer structure of the composite laminate of the present invention may, for example, be glass substrate/F resin layer/metal layer, F resin layer/glass substrate/F resin layer/metal layer, or metal foil/F resin layer/glass substrate/F resin layer/metal layer. The "glass substrate/F resin layer/metal layer" means that the glass substrate, the F resin layer and the metal layer are laminated in this order, and the same applies to the other layer structure.

The material of the metal foil may, for example, be copper, a copper alloy, stainless steel, nickel, a nickel alloy (including 42 alloy), aluminum, an aluminum alloy, titanium, or a titanium alloy.

The metal foil may, for example, be a rolled copper foil or an electrolytic copper foil. On the surface of the metal foil, an anti-corrosive layer (such as an oxide coating of e.g. chromate) or a heat resistant layer may, for example, be formed.

The ten point height of irregularities of the surface of the metal foil is preferably from 0.2 to 1.5 µm. In such a case, adhesion to the F resin layer tends to be good, and a printed board excellent in transmission properties is likely to be obtained.

The thickness of the metal foil may be a thickness with which the metal foil can fulfil its function when used as a metal foil with a resin.

The surface of the metal foil may be treated with a silane coupling agent, the whole surface of the metal foil may be treated with a silane coupling agent, or a part of the surface of the metal foil may be treated with a silane coupling agent.

The composite laminate of the present invention may be produced by contact-bonding the glass resin laminate of the present invention and the metal foil by hot press method.

The temperature at the time of contact bonding is preferably at least the melting temperature of the TFE polymer, more preferably a temperature higher by at least 10° C. than the melting point, further preferably a temperature higher by at least 20° C. than the melting point, particularly preferably a temperature higher by at least 40° C. than the melting point. The temperature at the time of contact bonding is preferably not higher than a temperature higher by 100° C. than the melting point. When the temperature at the time of contact bonding is within the above range, the F resin layer and the metal foil can be sufficiently bonded while heat deterioration of the TFE polymer is suppressed. The temperature at the time of contact bonding means the temperature of the heating platen.

The pressure at the time of contact bonding is preferably at least 0.2 MPa, more preferably at least 0.5 MPa, particularly preferably at least 1.0 MPa. The pressure at the time of contact bonding is preferably at most 10.0 MPa. When the pressure at the time of contact bonding is within the above range, the F resin layer and the metal foil can be sufficiently bonded without breaking the glass substrate.

Contact bonding is carried out preferably in a vacuum atmosphere. The degree of vacuum is preferably at most 100 kPa, more preferably at most 50 kPa, particularly preferably at most 20 kPa. When the degree of vacuum is within the above range, inclusion of bubbles in the interface between the F resin layer and the metal foil constituting the composite laminate can be suppressed and in addition, deterioration by oxidation can be suppressed.

Further, it is preferred to increase the temperature after the degree of vacuum is reached. If the temperature is increased before the degree of vacuum is reached, the glass resin laminate and the metal foil may be contact bonded in a state where the F resin layer is softened, that is in a state where the F resin has a certain fluidity and adhesion, thus leading to bubbles.

The composite laminate of the present invention may be used to produce a printed board as a copper clad laminated sheet.

A printed board can be produced from the composite laminate of the present invention, for example, by a method of processing the metal foil of the composite laminate of the present invention into a predetermined patterned transmission circuit e.g. by etching, or a method of processing the metal foil of the composite laminate of the present invention into a transmission circuit by electrolytic plating method (such as semi-additive process (SAP) or modified semi-additive process (MSAP)).

In production of a printed board, after a transmission circuit is formed, an interlayer insulating film may be formed on the transmission circuit, and a transmission circuit may further be formed on the interlayer insulating film. The interlayer insulating film may be formed, for example, by the powder dispersion of the present invention.

In production of the printed board, a solder resist may be laminated on the transmission circuit. The solder resist may be formed, for example, by the powder dispersion of the present invention.

In production of the printed board, a coverlay film may be laminated on the transmission circuit. The coverlay film may be formed, for example, by the powder dispersion of the present invention.

EXAMPLES

Now, the present invention will be described in further detail with reference to Examples of the present invention. However, it should be understood that the present invention is by no means restricted thereto.

Various measuring methods are shown below.
(Ra of Surface of Glass Substrate)

The surface of the glass substrate within 1 um$^2$ range was measured using an atomic force microscope (manufactured by Oxford Instruments) with a probe AC160TS-C3 (tip R<7 nm, spring constant: 26 N/m), at a measurement mode of AC-Air, at a scan rate of 1 Hz.

(Storage Elastic Modulus of Polymer)

The TFE polymer was heated at a rate of 2° C./min from 20° C., in accordance with ISO 6721-4:1994, using a dynamic viscoelasticity measuring apparatus (manufactured by SII nanotechnology, DMS6100) at a frequency of 10 Hz, with a static force 0.98 N and a dynamic displacement of 0.035%, and the storage elastic modulus at 260° C. was measured.

(Melting Point of Polymer)

Using a differential scanning calorimeter (manufactured by Seiko Instruments Inc., DSC-7020), the TFE polymer was heated at a rate of 10° C./min to measure the melting point.

(D50 and D90 of Polymer)

Using a laser diffraction/scattering particle size distribution measuring apparatus (manufactured by HORIBA, Ltd., LA-920 measuring apparatus), D50 and D90 were measured with respect to the powder dispersed in water.

(Warpage)

A 180 mm square test specimen was cut out from the glass resin laminate. With respect to the test specimen, the warpage was measured in accordance with the measurement method as specified in JIS C6471:1995. The smaller the warpage, the more laminate failure when the glass resin laminate was laminated with other material can be suppressed, and a composite laminate (such as a printed board) having warpage suppressed and having high flatness can be obtained.

(Adhesion)

In accordance with JIS K5600-5-6:1999, Testing method for paints-Part 5: Mechanical property of film-Section 6: Adhesion test (Cross-cut test) (corresponding international standard (ISO 2409:1992), adhesion of the F resin layer in the glass resin laminate was evaluated based on the following evaluation standard.

0: No grid cell peeled.

1: Significant peeling occurred partly or entirely along the cut lines.

(Peel Strength)

A rectangular test specimen having a length of 100 mm and a width of 10 mm was Cut out from the composite laminate. One copper foil and the F resin layer were peeled from one end to a position of 50 mm in the test specimen length direction. Then, at the position of 50 mm from one end in the test specimen length direction being the center, they were peeled using a tensile tester (manufactured by ORIENTEC CORPORATION) at a pulling rate of 50 mm/min 90 degrees, and the maximum load was taken as the peel strength (N/10 mm). A higher peel strength indicates more excellent adhesion between the F resin layer and the copper layer.

Materials used are shown below.

Glass substrate (1): Alkali glass (manufactured by AGC Inc., AS, about 50 mm×about 12.5 mm×about 0.5 mm in thickness, the uneven surface of the principal plane has no convex portion which narrows at its root portion as compared with the tip portion, formed).

Glass substrate (2): Alkali-free glass (compositional ratio, mol %, $SiO_2$: 57.954, $Al_2O_3$: 10.0, $B_2O_3$: 25.0, MgO: 2.0, CaO: 3.0, SrO: 2.0, BaO: 0, FeO: 0.046, about 50 mm×about 12.5 mm×about 0.5 mm in thickness, the uneven surface of the principal plane has no convex portion which narrows at its root portion as compared with the tip portion, formed).

Powder (1): A powder comprising a polymer $F^1$ having 97.9 mol % of TFE units, 0.1 mol % of NAH units and 2.0 mol % of PPVE units (storage elastic modulus at 260° C.: 1.1 MPa, molting point: 300° C.) (D50: 1.7 μm, D90: 3.8 μm).

Copper foil (1): A copper foil having a roughened surface (manufactured by MITSUI MINING & SMELTING CO., LTD., HS1-VSP, thickness: 18 μm).

Ex. 1

One principal plane of the glass substrate (1) was subjected to etching treatment with a high temperature hydrogen fluoride gas. In the etching treatment, the treatment temperature was 650° C., the etching gas was a mixed gas of nitrogen (97 vol %) and hydrogen fluoride gas (3 vol %), and the treatment time was 4 seconds.

Ra of the principal plane of the glass substrate (1) after the etching treatment was 32 nm, and as a result of analysis of the cross section of the principal plane with a scanning electron microscope (SEM), it was confirmed that the principal plane had an uneven surface and had a convex portion which narrowed at at least a part of the root portion as compare with the tip portion.

A powder dispersion containing 50 parts by mass of the powder (1), 5 parts by mass of a nonionic fluorinated surfactant (manufactured by NEOS COMPANY LIMITED, FTERGENT 710FL) and 45 parts by mass of N-methylpyrrolidone was applied to the uneven surface of the glass substrate (1), dried at 100° C. for 10 minutes, fired in an inert gas atmosphere at 350° C. for 30 minutes and then annealed to obtain a glass resin laminate (1) having the glass substrate (1) and a F resin layer (thickness: 15 μm) in contact with the uneven surface of the glass substrate (1).

The glass resin laminate (1) and the copper foil (1) were overlaid so that the F resin layer of the glass resin laminate (1) and the roughened surface of the copper foil (1) were in contact with each other, and hot-pressed in vacuum at a temperature of 350° C. under a pressure of 3.0 MPa for 15 minutes to obtain a composite laminate (1) having the glass substrate (1), the F resin layer and the copper foil (1). The evaluation results are shown in Table 1.

Ex. 2 to 5

A glass resin laminate and a composite laminate were produced and evaluated in the same manner as in Ex. 1 except that the conditions for the etching treatment of the glass substrate (1) were changed as identified in Table 1. The results are shown in Table 1. The cross section of the surface of the glass resin laminate in each of Ex. 1 to 4 was analyzed with SEM and as a result, a space was present in a part of the interface between the glass substrate and the F resin layer.

Ex. 6

A glass resin laminate and a composite laminate were produced and evaluated in the same manner as in Ex. 1 except that the glass substrate (2) was used instead of the glass substrate (1). The results are shown in Table 1. The cross section of the surface of the glass resin laminate in Ex. 6 was analyzed with SEM and as a result, a space was present in a part of the interface between the glass substrate and the F resin layer.

TABLE 1

| | Glass substrate | | | | Glass resin laminate | | Composite laminate |
|---|---|---|---|---|---|---|---|
| | Etching treatment conditions | | | | | | |
| Ex. | Treatment temperature [°C.] | HF gas concentration [vol %] | Treatment time [sec] | Ra [nm] | Warpage [%] | Adhesion | Peel strength [N/cm] |
| 1 | 650 | 3 | 4 | 32 | 0.1 | 0 | 11 |
| 2 | 600 | 5 | 4 | 35 | 0.2 | 0 | 11 |
| 3 | 650 | 5 | 4 | 39 | 0.1 | 0 | 10 |
| 4 | 700 | 5 | 4 | 40 | 0.1 | 0 | 10 |
| 5 | | Untreated | | — | 4.0 | 1 | 3 |
| 6 | 650 | 3 | 4 | 40 | 0.1 | 0 | 11 |

Even after the glass resin laminate in each of Ex. 1 to 4 was subjected to 338 cycles of a heat shock test of immersing the laminate in a bath at −55° C. and a bath at +125° C. each for 30 minutes, its peel strength did not change and it have excellent adhesion.

INDUSTRIAL APPLICABILITY

The glass resin laminate of the present invention, in which the glass substrate and the resin layer containing a TFE polymer are firmly laminated, is hardly warped and is excellent in the electrical properties, and is thereby useful e.g. as an insulating material for forming a printed board.

This application is a continuation of PCT Application No. PCT/JP2019/025150, filed on Jun. 25, 2019, which is based upon and claims the benefit of priority from Japanese Patent Application No. 2018-124145 filed on Jun. 29, 2018. The contents of those applications are incorporated herein by reference in their entireties.

REFERENCE SYMBOLS

10: Glass substrate
12: Uneven surface
20: Convex portion
21: Specific convex portion
22: Specific convex portion
23: Neck portion

What is claimed is:

1. A glass resin laminate comprising a glass substrate having an uneven surface with an arithmetic mean roughness of at least 5 nm, and a resin layer containing a tetrafluoroethylene polymer in contact with the uneven surface,
wherein the uneven surface has a convex portion which narrows at at least a part of the root portion as compared With the tip portion,
wherein a space is present at a part of an interface between the glass substrate and the resin layer.

2. The glass resin laminate according to claim 1, wherein the uneven surface is formed by subjecting the glass substrate to etching treatment with a hydrogen fluoride gas.

3. The glass resin laminate according to claim 1, wherein the glass substrate has a thickness of from 0.1 to 5 mm, the resin layer has a thickness of from 1 to 1,000 μm, and the ratio of the thickness of the resin layer to the thickness of the glass substrate is from 0.01 to 0.2.

4. The glass resin laminate according to claim 1, wherein glass used for the glass substrate has an iron oxide content of from 0 to 1,000 ppm.

5. The glass resin laminate according to claim 1, wherein the resin layer is a non-porous resin layer.

6. The glass resin laminate according to claim 1, wherein the tetrafluoroethylene polymer is a tetrafluoroethylene polymer having a temperature region in which the storage elastic modulus is from 0,1 to 5.0 MPa at 260° C. or lower, and having a melting point of higher than 260° C.

7. The glass resin laminate according to claim 1, wherein the tetrafluoroethylene polymer has units based on tetrafluoroethylene and units based on at east one monomer selected from the group consisting of a perfluoro(alkyl vinyl ether), hexafluoropropylene and a fluoroalkylethylene.

8. The glass resin laminate according to claim 1, wherein the tetrafluoroethylene polymer has at least one type of functional group selected from the group consisting of a carbonyl group-containing group, a hydroxy group, an epoxy group, an amide group, an amino group and an isocyanate group.

9. A composite laminate comprising a glass substrate having an uneven surface with an arithmetic mean roughness of at least 5 nm, a resin layer containing a tetrafluoroethylene polymer in contact with the uneven surface, and a metal foil in contact with the resin layer, wherein the uneven surface has a convex portion which narrows at at least a part of the root portion as compared with the tip portion.

10. A method for producing a printed board, which comprises subjecting the metal foil of the composite laminate as defined in claim 9 to etching treatment to form a transmission circuit thereby to obtain a printed board.

* * * * *